(12) United States Patent
Vanaud

(10) Patent No.: US 8,405,404 B2
(45) Date of Patent: Mar. 26, 2013

(54) ASSEMBLY FOR DETECTING ELECTRIC DISCONTINUITY BETWEEN AN ELECTRIC CONTACT AND AN ELECTRICALLY CONDUCTING MEMBER MOUNTED IN THE DETECTION CIRCUIT

(75) Inventor: Sebastien Vanaud, Illkirch-Graffenstaden (FR)

(73) Assignee: Lohr Industrie, Hangenbieten (FR)

( * ) Notice: Subject to any disclaimer, the term of this patent is extended or adjusted under 35 U.S.C. 154(b) by 366 days.

(21) Appl. No.: 12/743,904

(22) PCT Filed: Nov. 14, 2008

(86) PCT No.: PCT/FR2008/001603
§ 371 (c)(1),
(2), (4) Date: Jul. 12, 2010

(87) PCT Pub. No.: WO2009/098373
PCT Pub. Date: Aug. 13, 2009

(65) Prior Publication Data
US 2010/0283477 A1    Nov. 11, 2010

(30) Foreign Application Priority Data
Nov. 21, 2007 (FR) ........ 07 08162

(51) Int. Cl.
*G01R 27/04* (2006.01)
*G01R 31/04* (2006.01)
*G01R 27/28* (2006.01)

(52) U.S. Cl. .......... 324/633; 324/538; 324/652
(58) Field of Classification Search .......... 324/633, 324/538, 652
See application file for complete search history.

(56) References Cited

U.S. PATENT DOCUMENTS

| 4,812,752 A | 3/1989 | Preuss |
| 2006/0017325 A1 | 1/2006 | Lohr |

FOREIGN PATENT DOCUMENTS

| DE | 19735282 | 2/1999 |
| EP | 1538058 | 6/2005 |
| FR | 2846917 | 5/2004 |

*Primary Examiner* — Amy He
(74) *Attorney, Agent, or Firm* — Davis & Bujold, PLLC

(57) ABSTRACT

An assembly (1) for detecting an electric discontinuity that includes an exciter (6) connected, via at least one capacitor, to two contacts (2, 3) normally connected between them by an electrically conducting member (4). The circuit outside the exciter defines a resonating circuit having an impedance that changes upon the opening of one of the contacts. The frequency of the detection circuit, which varies between two values corresponding to the two open or closed states of the contacts, is used by an electronic processing module (8) that generates a dysfunctional signal upon opening of one of the contacts. The invention can be used in numerous fields, such as transport, handling, storage, etc.

17 Claims, 5 Drawing Sheets

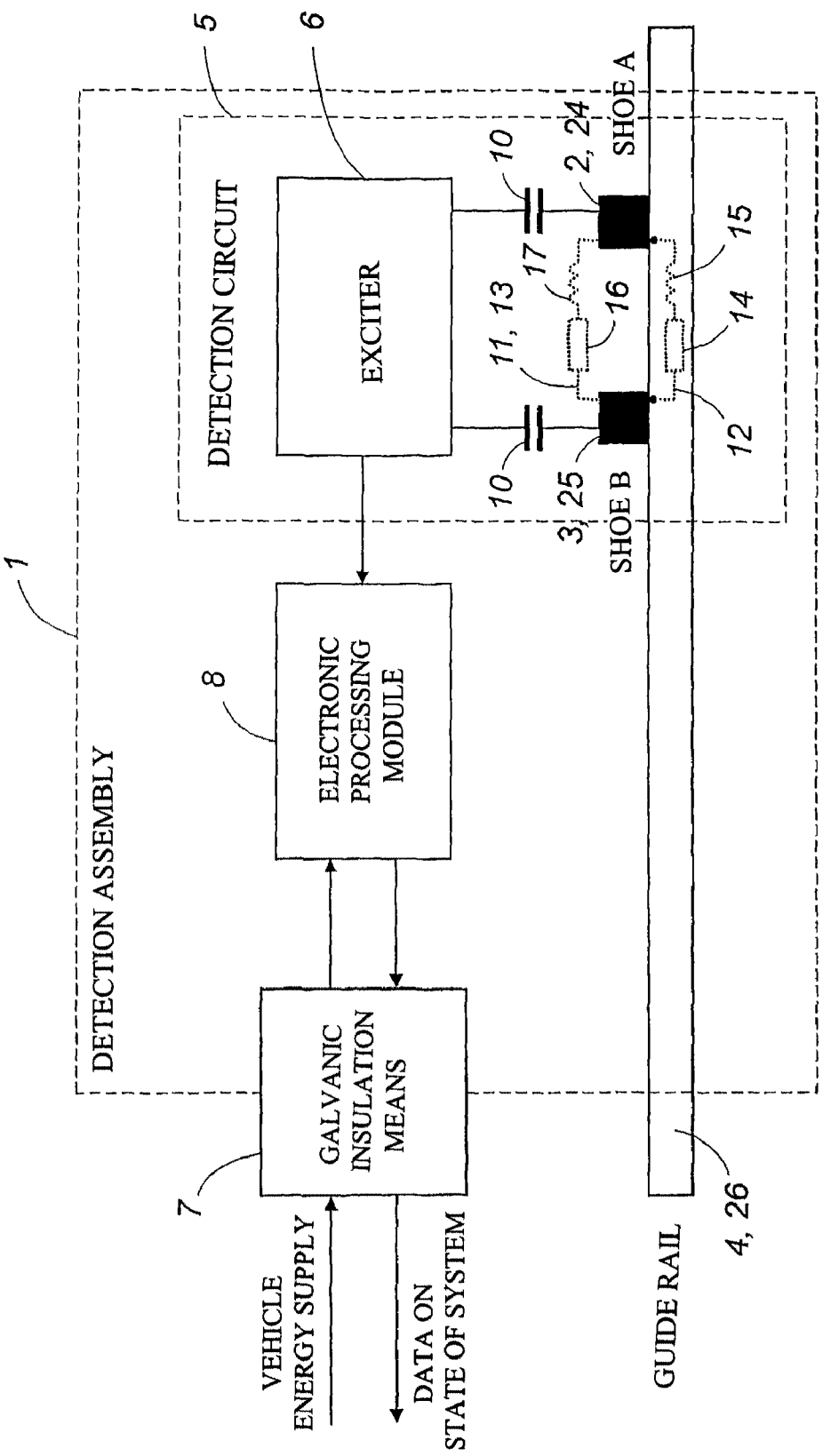

ASSEMBLY FOR DETECTING ELECTRIC DISCONTINUITY BETWEEN AN ELECTRIC CONTACT AND AN ELECTRICALLY CONDUCTING MEMBER MOUNTED IN THE DETECTION CIRCUIT

This application is a national stage completion of PCT/FR2008/001603 filed Nov. 14, 2008 which claims priority from French Application Serial No. 07 08162 filed Nov. 21, 2007.

FIELD OF THE INVENTION

The present invention relates to a detection circuit comprising at least two distinct electric contacts normally in contact with a common conducting member that connects them, and is able to detect an electric discontinuity between one of these electric contacts and the conducting member.

The present invention also concerns a detection assembly incorporating such a detection circuit.

More specifically, the invention relates to a detection assembly in which the two electric contacts move along a conductive mass, such as a travel or guide rail for a road vehicle.

BACKGROUND OF THE INVENTION

In numerous domains, for example, those that involve vehicles or transporting, handling or storing merchandise, it is useful to determine in real time whether two elements are in contact.

In these domains it is often necessary to ensure that certain elements which must remain in contact with one another but which are not attached to one another because they may need to move or to be displaceable, are actually in permanent contact.

Actually, two elements which should be in contact with one another under normal conditions of operation or use, inadvertently or accidentally may become separated due to some abnormal or unforeseeable situation. It is therefore very important and very useful, for reasons of safety or preventing malfunction, for example, to detect this situation in real time in order to implement corrective actions or safety measures without delay.

SUMMARY OF THE INVENTION

The detection apparatus according to the invention responds to this need using the electrically conductive property of the two elements whose contact is to be monitored.

By way of example, the preferred application to cite is the example of vehicles guided by guide system that slides along at least one guide rail. Specifically, this may consist, for example, of a public urban passenger transport vehicle, industrial carts that may be automated, or even handling vehicles.

In this case it is absolutely indispensable to ensure that the guide system is permanently in contact with the guide rail in order to detect and eliminate any risk of derailment, for example, in case there is a localized interruption in the guide rail, or if an obstacle or other object appears unexpectedly on the guide rail, or if there is frost or anything else that might cause the guide system to lift accidentally.

The present invention may be used to monitor contact between the guide system and the guide rail, more specifically, between two electric contacts on the guide system and the metal guide rail which joins them.

Such vehicles are sometimes equipped with a safety device placed in front of the guide assembly, with the role of feeling the guide rail before the guide assembly passes in order to ensure slightly in advance that the guide rail and its immediate surroundings are clear and in good state. The detection assembly of the invention advantageously will be used at this level to monitor contact between the safety device and the guide rail It is also possible to use the detection assembly of the invention to monitor elements that must remain in contact with a travel rail.

However, applications of the present invention are not limited to the domain of vehicles moving along one or more guide rails or travel rails and they may extend to numerous other situations.

For example, such a detection assembly advantageously can be used to monitor contact between the feet of a container, a box, a tank, or the like and the support it rests on in order to safeguard transporting, handling, or storing it, for example.

To do this, the container is equipped with metal feet or at least two distinct metal contact zones. Likewise, the support must be electrically conductive between these two contact zones and for this reason it should be completely or partially metal, or covered with electrically conductive material or with a simple electrical connection strip.

A person skilled in the art can easily conceive of numerous other applications for the detection assembly of the invention.

The invention concerns a detection assembly comprising two electric contacts, or two electric contact zones, connected by an electrically conductive or low resistive member or mass.

Absence of contact between at least one of the two electric contacts and the conductive member with which it is supposed to be in contact, is detected by seeking out the electric discontinuity between the contacts connected to each other by the electrically conductive member.

Thus, the present invention provides an assembly for detecting electric discontinuity between an electric contact and an electrically conducting member, the assembly comprising two distinct electric contacts and an electrically conductive member connecting them with which the electric contacts are normally in contact.

According to the invention the detection assembly comprises an exciter comprising a resonating circuit as its charge, the resonating circuit comprising from one of the terminals on the exciter and returning to its other terminal, at least one capacitor, one of the electric contacts, a portion with an impedance that varies depending upon whether at least one of the contacts is open or closed, the second electric contact.

The variable impedance portion comprises, in a normal contact situation, a first resistive and self-inductive branch formed of the conducting member and at least one second resistive and self-inductive branch connected in parallel and formed of a constructive electrical connection joining the two contacts. The first branch is off-line when at least one of the contacts opens.

The detection circuit further comprises an electronic processing module that receives the oscillation frequency of the resonating circuit and converts it into a fault signal to be used in case of electric discontinuity.

As for the two parallel branches of the variable impedance portion, preferably the inherent electrically resistant qualities and self-inductive effects on the one hand, of the conductive member for one of the branches and, on the other hand, of the whatever type electric connection existing between the contacts in addition to and independently of the conductive member for the other branch, are used.

When the natural resistive and self-inductive effects of these connections are too weak to be used satisfactorily in the detection circuit of the invention, it is possible to add supplementary resistive and/or self-inductive electric components in order to amplify the effect desired.

Likewise, if in the application concerned no electric connection exists between the contacts except for the conducting member, the contacts are then joined by an electric connecting wire or other suitable connection.

The invention offers a complete detection assembly that integrates a detection circuit and further comprises an electronic processing module to convert the variations resulting from the detection circuit into a detection signal and to output useful data about the electrical state of the contacts being monitored.

This data can then be sent to an auditory or visual alarm system, or it can be used by a general surveillance or control system capable of engaging suitable safety measures.

In the prior art numerous detection circuits have been described, for examples, the circuits disclosed in patents DE 197 35 282 in the name of SEKURIT SAINT GOBAIN and U.S. Pat. No. 4,812,752 in the name of PREUS. However, these circuits are very different from the detection assembly of the invention and do not resolve the technical problem.

BRIEF DESCRIPTION OF THE DRAWINGS

Other characteristics and features of the invention will be apparent from the following description provided by way of example and accompanied by drawings, in which:

FIG. 5 is the general electric schema of a variation being applied to friction shoes on a vehicle moving along a metal guide rail.

DETAILED DESCRIPTION OF THE INVENTION

Figure 1:
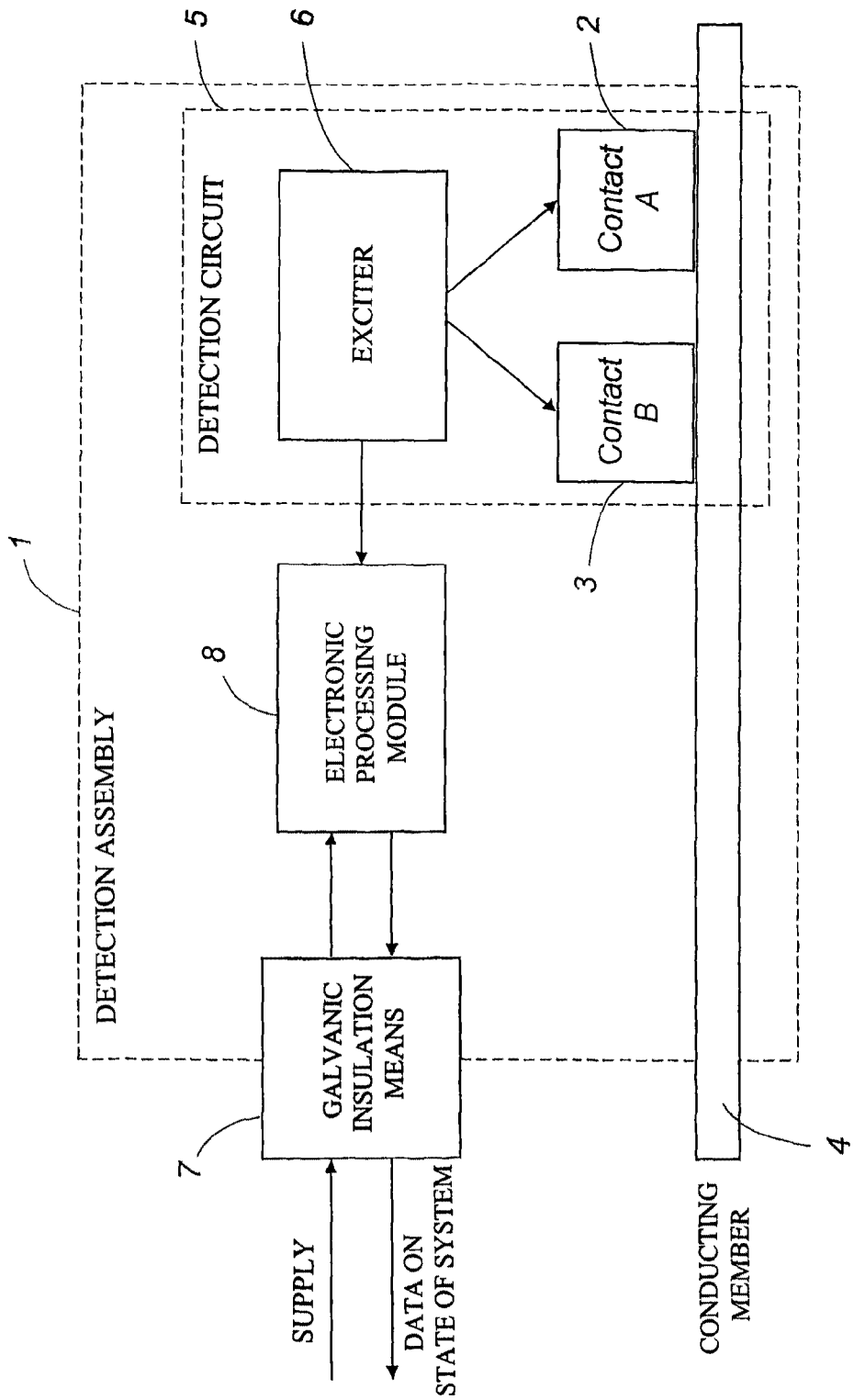
FIG. 1 is a general functional schema of a detection assembly according to the invention applied to any two contact zones.

To assist the reader in understanding the invention, FIG. 1 represents the general global functional schema of a detection assembly 1 according to the invention.

This detection assembly 1 monitors the existence of a contact between a pair of electric contacts 2 and 3, respectively denoted as Contact A and Contact B in the drawings, and a conducting member 4 with which they are supposed to remain in contact.

Electric contacts 2 and 3 may be fixed or movable and of any type and extent. According to a preferred application shown in FIG. 5, they may be a shoe sliding along a metal travel or guide rail, for example. They may also be feet or contact zones that must rest on a conductive support or on conductive receptor zones of a support.

Conducting member 4 establishes an electric connection between contacts A and B when both of them are in contact with it.

Conducting member 4 may be any type of element. For example, it may be a metal mass, profile, or covering. Or it may be a simple connecting wire joining two conductive receptor zones designed to receive contacts A and B, or any other appropriate conducting member conceived by a person skilled in the art according to the application desired for detection assembly 1 of the invention.

To learn whether the contacts 2 and 3 are electrically open or closed relative to conducting member 4, that is, to learn whether or not they are in electrical contact with it, detection circuit 5 is used.

Figure 2:
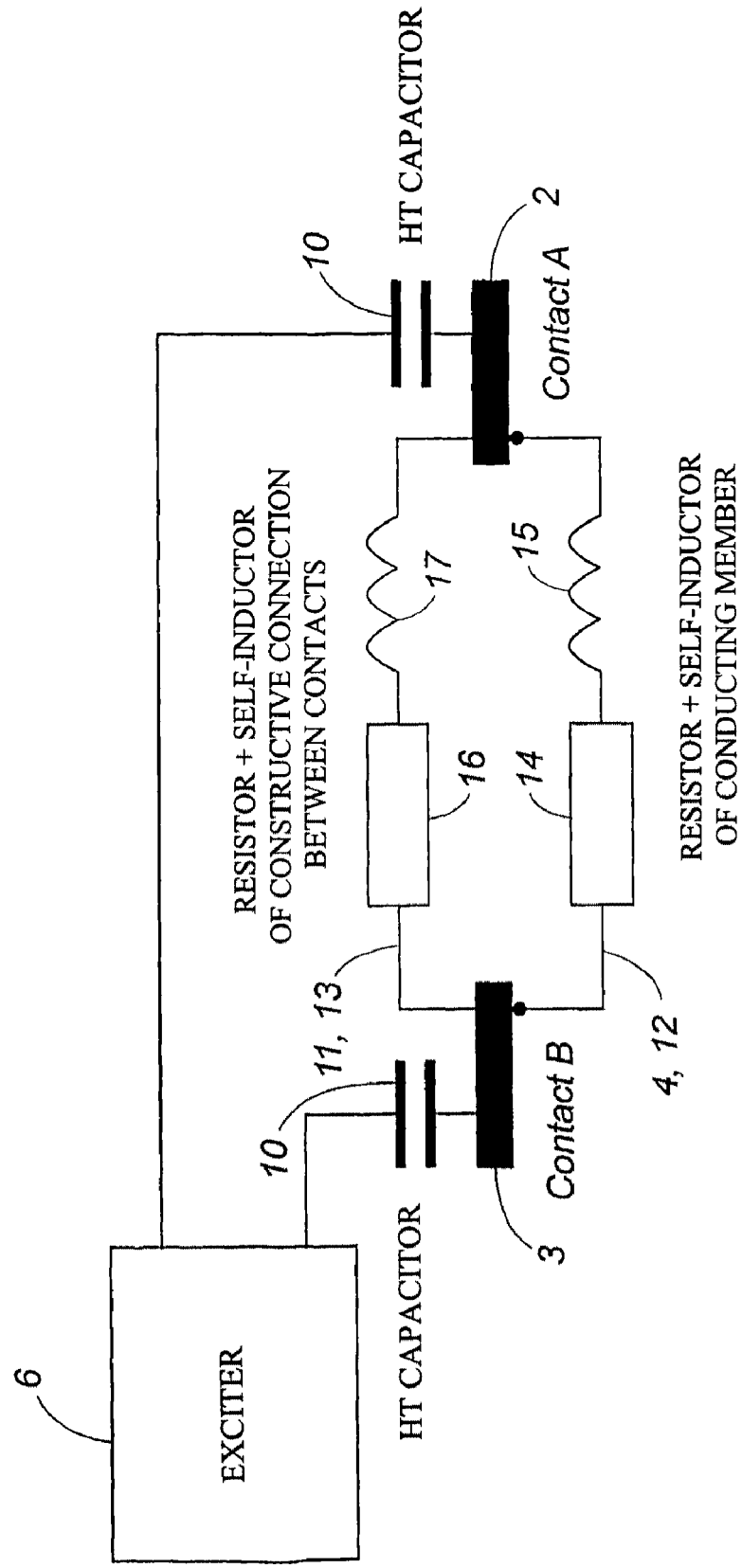
FIG. 2 is a block schema of a detection circuit according to the invention.

This detection circuit 5, the operation of which will be studied in greater detail with reference to FIG. 2, forms a reference loop in the core of detection assembly 1 and comprises an electrical excitation device called exciter 6 connected to contacts A and B through one or more capacitors.

Exciter 6 is an energy generating element for a resonating circuit. It may consist, for example, of an electronic component or a circuit with an unstable operational amplifier, or any other generator.

In this loop conducting member 4 may represent the electrical ground.

The energy supply, necessary for the operation of detection assembly 1, comes from the outside and must preferably be electrically insulated from the ground and thus from conducting member 4. Detection assembly 1 is thus preferably insulated by a galvanic insulation means 7.

Detection assembly 1 also comprises an electronic processing module 8 that converts the variations in oscillation frequency coming from detection circuit 5 into a useful fault signal.

As will be seen below, the oscillation frequencies in detection circuit 5 are different depending upon whether contacts A and B are electrically connected to conducting member 4, or whether this connection is interrupted due to the opening or detachment of at least one of contacts A or B, or because of a fault in the portion of conducting member 4 located between the two contacts A and B.

Depending upon the differences between the frequency values of detection circuit 5, electronic processing module 8 delivers useful data to the outside representing the electrical condition of at least one of the contacts.

This information can then be used in different ways depending on the application desired. For example, it may be sent to an auditory or visual alarm system, or to a general control system which can engage corrective actions or security measures if needed.

The detection function results from detection circuit 5, the electrical operation of which is shown schematically in FIG. 2.

Exciter 6 is preferably an electric excitation device in the form of a component or an electric circuit periodically supplying energy, with each of its output terminals connected to one of contacts A or B through at least one capacitor 10.

In the preferred example shown, detection circuit 5 comprises a capacitor 10 interposed between each terminal on exciter 6 and corresponding electric contact 2 or 3.

These capacitors 10 prevent continuous voltage, possibly flowing from conducting member 4, from being transmitted to exciter 6 and especially to electronic processing module 8. Electronic processing module 8 is therefore insulated from any possible continuous potential of contacts A and B.

Under normal operating conditions, contacts A and B are electrically connected to each other in two ways: by means of conducting member 4 and by a constructive connection 11. These two connections respectively form a first branch 12 and a second branch 13 of a circuit with two parallel branches closing the loop of detection circuit 5.

Constructive connection 11 is an electric connection that can be made in any way. For example, it may be a structural connection through the chassis, the frame, or other elements on the object to which contacts 2 and 3 are attached. It may also be a specific connection such as a wire or the like used uniquely in detection circuit 5 of the invention or having one or more other functions of any type.

If such an electrical connection does not exist between contacts 2 and 3 in the desired application, a specific constructive connection 11 must be added between the contacts to ensure proper operation of detection assembly 1.

Each of the parallel branches 12 and 13 on detection circuit 5 has inherent resistive and self-inductive characteristics, symbolized in FIG. 2 by, and equivalent to, an electric resistor and a self-inductor, 14 and 15, respectively, for the first branch 12, and 16 and 17 for the second branch, associated in series.

This circuit with two parallel branches constitutes a portion of the charge for exciter 6 under normal operating conditions, that is, when contacts A and B are both in contact with conducting member 4. The other portion of the charge consists of the two connectors that may possibly contain a capacitor 10. Thus, along with exciter 6, an oscillating circuit with a resonating portion RLC has been formed having its own oscillation frequency called contact frequency $F_C$.

When at least one of contacts A or B is no longer in electrical contact with conducting member 4, the first branch 12 of the assemblage is off-line. Contacts A and B are therefore now connected only by constructive connection 11 forming the second branch 13 of the assemblage.

The charge of exciter 6 is modified and equivalent to a resonating circuit RLC having different resistive and self-inductive values. The oscillation frequency of the resonating circuit changes and becomes a weaker frequency called the detachment frequency $F_D$.

Figure 3:
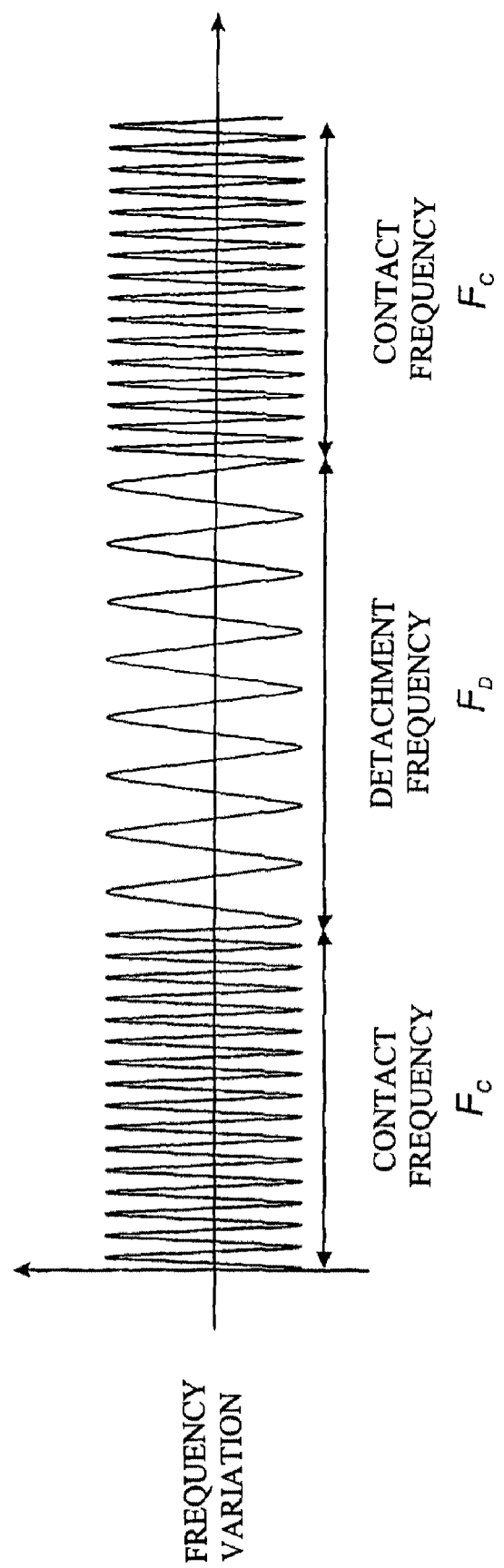
FIG. 3 is a graphic representing a wave shape illustrating the frequency variation of the detection circuit resulting from an absence of electric contact.

One example of such a variation in oscillation frequency has been illustrated in FIG. 3.

Oscillation frequency values $F_C$ and $F_D$ of the resonating circuit depend upon the resistive and self-inductive values of the two branches 12 and 13.

In the case of an application of the detection assembly of the invention in a guided vehicle on a conductive rail, a frequency $F_C$ preferably generally equal to 5 MHz and a frequency $F_D$ preferably generally equal to 4 MHz can be cited for example.

When the natural resistive and self-inductive effects of the electrical connections forming branches 12 and 13 are too weak to be satisfactorily used in detection circuit 5 of the invention, it is possible to add one or more supplementary resistive and/or self-inductive electric components in order to amplify the desired effect.

A supplementary branch comprising only a resistor or only a self-inductor or both components connected in series can then be connected in parallel on the first branch 12 and/or on the second branch 13.

Advantageously, detection circuit 5 of the invention can detect the detachment of each of contacts 2 or 3 independently of the state of the other. Therefore, it is not necessary for both contacts to be detached in order for the circuit to detect a fault. Likewise, detection circuit 5 can detect an interruption in the electric circuit between the two contacts 2 and 3, that is, a fault in the portion of conducting member 4 located between these two.

This variation in oscillation frequency of the resonating circuit is used by the electronic processing module 8 to transform it into a fault signal $S_D$ that can later be used by a monitoring, control, or alarm system, for example.

Figure 4:
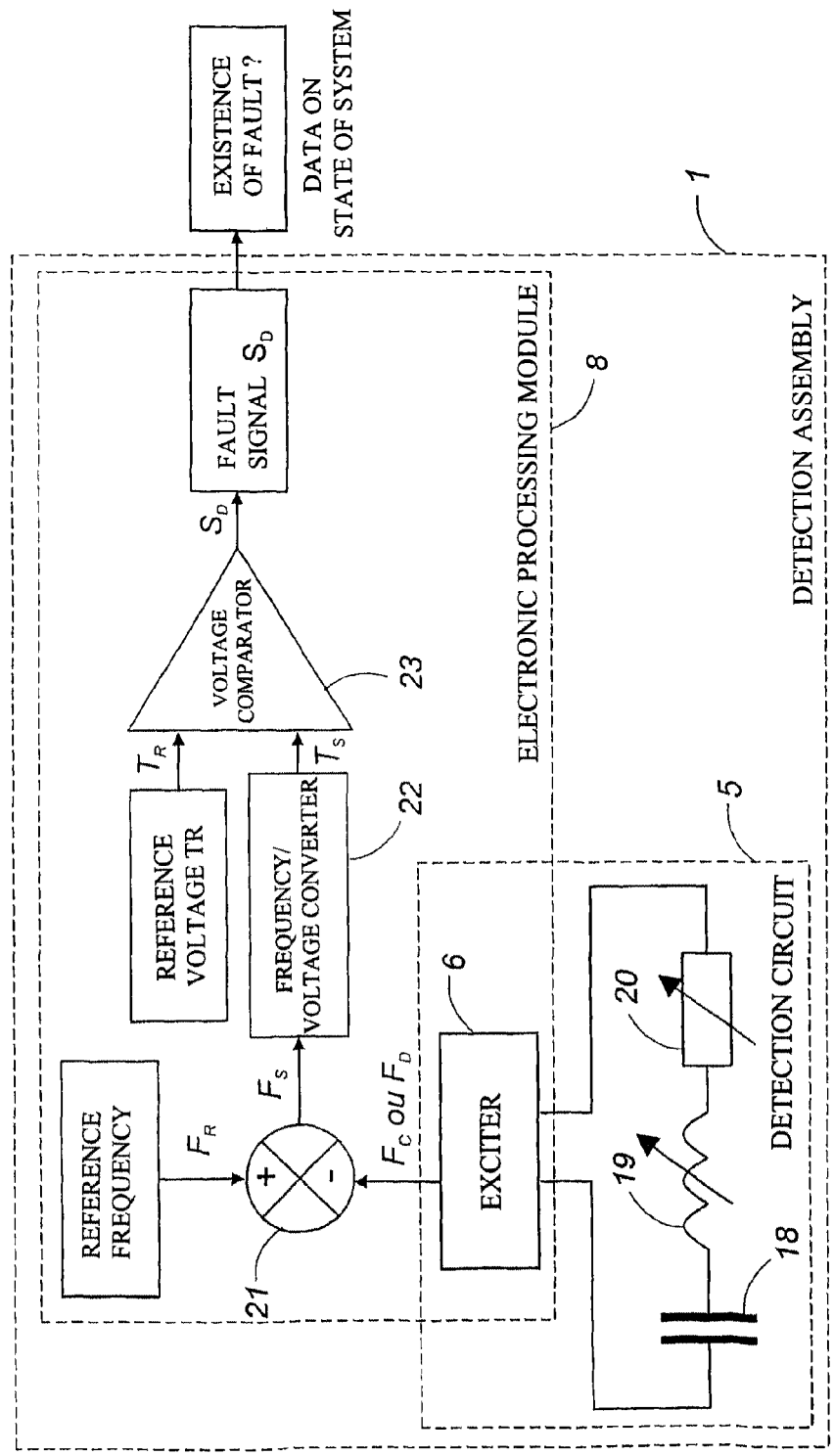
FIG. 4 is an example of an electric schema of the detection assembly according to the invention.

A preferred embodiment of electronic processing module 8 has been shown in the electrical schema in FIG. 4 and will now be described.

In this drawing, detection circuit 5 has been symbolized by an equivalent RLC circuit comprising at the terminals of exciter 6 a fixed capacitor 18, a variable self-inductor 19 and a resistor 20, also variable, connected in series.

Self-inductor 19 and resistor 20 have been shown as variable because, as explained before, they may assume two different values depending upon whether detection circuit 5 comprises one branch 13 or two branches 12 and 13 in parallel, that is, depending upon whether contacts A and B are both in contact with conducting member 4 or not.

Detection circuit 5 therefore has at the output an oscillation frequency which, depending on the case, may take on a contact value $F_C$ or a detachment value $F_D$.

The output of exciter 6 at contact frequency $F_C$ or detachment frequency $F_D$ supplies a mixer 21, the other input of which receives a reference frequency $F_R$ and from which a periodic signal originates at output frequency $F_S$, which is weaker, representing the difference between the two input signals.

It is then possible, either in advance or afterwards, to divide the input frequency of the mixer by a large number (for example 1000) in order to use conventional business components.

The sinusoidal signal with differential output frequency $F_S$ then passes to a frequency/voltage converter 22 that transforms the output frequency $F_S$ into output voltage $T_S$.

Output voltage $T_S$ is compared to a reference voltage $T_R$ in a voltage comparator 23 which produces a fault signal $S_D$ that can be put to use later, for example, in an exterior monitoring system.

The difference between the oscillation frequency $F_C$ of the resonating circuit in a normal contact situation and the oscillation frequency $F_D$ in the resonating circuit when there is an electrical discontinuity is considerable. It is preferably at least 20% which, after mixing, conversion into voltage and comparison, produces a clear, significant fault signal $S_D$ that can be useful later.

The circuit assembly is preferably tuned in such a way that during simultaneous electrical contact by the two contacts 2 and 3, the oscillation frequency $F_C$ of the resonating circuit after passing into the detection chain corresponds to an insufficient voltage to provoke a useful fault signal $S_D$.

To further illustrate the invention, a preferred but non-limiting application of the invention has been shown in FIG. 5.

This application concerns detection of the lifting of one or two friction shoes 24 and 25 that slide along a metal guide rail 26 and with which they are supposed to remain in contact.

These shoes 24 and 25 belong to the guide system of a guided public transport vehicle. They could just as well be electric mass shoes or current return shoes.

A detection assembly 1 according to the invention may be connected to these shoes 24, 25 and attached to the vehicle.

According to a preferred embodiment of detection assembly 1, it may be contained in a compact housing possibly attached above shoes 24 and 25 in an element sliding along the guide rail.

Detection assembly 1 according to the invention operates in the same way as before with shoes 24 and 25 serving as contacts A and B, respectively, and metal guide rail 26 replacing conducting member 4.

The vehicle supplies the energy required for detection assembly 1 to operate although it remains insulated from the vehicle by means of galvanic insulation means 7.

Constructive connection 11 forming the second branch 13 of detection circuit 5 is ensured by means of the vehicle frame if there are electric mass shoes or by a mutual overhead connection for current return shoes.

Electronic processing module 8 transmits in real time data on the condition of detection assembly 1 to the general system ensuring vehicle central control and transportation safety, which, if needed can engage preventive safety measures such as emergency braking, for example, if a fault is indicated.

Advantageously, detection assembly 1 of the invention can detect the detachment of each of shoes 24 or 25 independently of the condition of the other one. Thus it is not necessary for both shoes to be detached in order for the system to detect a fault. Likewise, the detection system can detect an electric circuit interruption between the two shoes 24 and 25, that is, a fault in the portion of guide rail 26 that is located between the two shoes.

Advantageously, each shoe forming a part of the guide assembly can occur two by two in a detection circuit 5 according to the invention. The resulting fault detection signal would then be different depending upon the pair of shoes that has lost contact, allowing the problem to be located automatically and immediately.

It is apparent that the invention is not limited to the preferred embodiments previously described and shown in the various drawings, since a person skilled in the art could conceive of various obvious modifications that would remain in the scope of the claims.

The invention claimed is:

1. An assembly for detecting electric discontinuity between an electric contact and an electrically conducting member, the assembly comprising:
   two distinct electric contacts being contact and connected by the electrically conducting member,
   an exciter (6) comprising a resonating circuit which transmits a charge from a first terminal to a second terminal, the resonating circuit comprising from one terminal of the exciter to return to another terminal, at least one capacitor, one of the two electric contacts, a portion with variable impedance depending upon whether at least one of the contacts is either open or closed, and the second electric contact;
   the variable impedance portion comprises, in a normal contact situation, a first resistive and self-inductive branch formed of the conducting member and at least one second resistive and self-inductive branch connected in parallel and formed of a constructive electric connection joining the two electric contacts; the first resistive and self-inductive branch being placed off-line when at least one of the two electric contacts opens; and
   an electronic processing module for receiving an oscillation frequency of the resonating circuit and converting the oscillation frequency into a fault signal that is used if there is an electric discontinuity.

2. The detection assembly according to claim 1, wherein the capacitor is interposed between each terminal of the exciter and the corresponding electric contact.

3. The detection assembly according to claim 1, wherein at least one supplemental branch, comprises at least one of a resistor and a self-inductor connected in series, is connected in parallel on one of the first branch and the second branch.

4. The detection assembly according to claim 1, wherein the assembly is insulated by a galvanic insulation means.

5. The detection assembly according to claim 1, wherein a difference between an oscillation frequency ($F_C$) of the resonating circuit in the normal contact situation and an oscillation frequency ($F_D$) of the resonating circuit if there is electric discontinuity is greater than or equal to 20%.

6. The detection assembly according to claim 5, wherein the oscillation frequency of the resonating circuit is substantially equal to 5 MHZ for the normal contact situation and 4 MHz if there is electric discontinuity.

7. The detection assembly according to claim 1, wherein the electronic processing module comprises a mixer that receives the oscillation frequency of the resonating circuit and a reference frequency ($F_R$), the mixer is connected to a frequency/voltage converter with its output joined to a comparator receiving a reference voltage ($T_R$) in order to emit a fault signal ($S_D$) if there is electric discontinuity, and the electric discontinuity is translated by an oscillation frequency variation in the resonating circuit.

8. The detection assembly according to claim 7, wherein an input frequency of the mixer is divided in order to use conventional components.

9. The detection assembly according to claim 1, wherein the circuit assembly is tuned such that during the normal contact situation, the oscillation frequency ($F_C$) of the resonating circuit is converted, after passing into the electronic processing module, into a voltage that is insufficient to give rise to a useful fault signal ($S_D$).

10. The detection assembly according to claim 1, wherein the electrically conducting member is one of a metal mass, a profile, a coating and an electric wire joining two conductive receptor zones designed to receive the two contacts.

11. The detection assembly according to claim 1, wherein the constructive electric connection is one of a structural electric connection and a specific electric connection.

12. The detection assembly according to claim 1, wherein the two contacts move along the electrically conducting member.

13. The detection assembly according to claim 12, wherein the electrically conducting member is one of a metal guide rail and a travel rail and the two contacts are shoes sliding along the one of the metal guide rail and the travel rail.

14. The detection assembly according to claim 13, wherein the assembly is located inside a housing mounted above the shoes in an element that slides along the guide rail.

15. The detection assembly according to claim 13, wherein the shoes are one of electric mass shoes and current return shoes.

16. The detection assembly according to claim 13, wherein the assembly is attached to a guided public transport vehicle and supplied with energy by a vehicle.

17. An assembly for detecting electric discontinuity between at least one of a first and a second electrical contact and an electrical conducting member, the electrical conducting member contacting and connecting the first and the second electrical contacts in a normal contact situation;
   an exciter comprising a resonating circuit which transmits a charge from a first terminal of the exciter to a second terminal of the exciter, via at least one capacitor, the first electrical contact, the second electric contact and a portion with variable impedance depending upon whether at least one of the first and the second is open or closed;
   the portion with variable impedance portion comprises, in the normal contact situation, a first resistive and self-inductive branch, formed of the electrical conducting member, and at least one second resistive and self-inductive branch, formed of a constructive electric connection, the first and the second resistive and self-inductive branches are connected in parallel and join the first and the second electrical contacts, the first resistive and self-inductive branch being disconnected when at least one of the first and the second electrical contacts opens; and
   an electronic processing module communicating with the resonating circuit receives an oscillation frequency of the resonating circuit and converts oscillation frequency into a fault signal if there is an electric discontinuity.

* * * * *